United States Patent
McLaury

[11] Patent Number: 5,457,654
[45] Date of Patent: Oct. 10, 1995

[54] MEMORY CIRCUIT FOR PRE-LOADING A SERIAL PIPELINE

[75] Inventor: Loren McLaury, Boise, Id.

[73] Assignee: Micron Technology, Inc., Boise, Id.

[21] Appl. No.: 280,929

[22] Filed: Jul. 26, 1994

[51] Int. Cl.[6] .................................................. G11C 7/00
[52] U.S. Cl. .............................. 365/189.01; 365/189.05; 365/221; 365/49
[58] Field of Search ...................... 365/189.01, 189.12, 365/221, 230.09, 189.03, 189.04, 189.05, 230.05, 49

[56] References Cited

U.S. PATENT DOCUMENTS

| | | | |
|---|---|---|---|
| 5,115,413 | 5/1992 | Sato et al. | 365/230.09 |
| 5,179,372 | 1/1993 | West et al. | 365/230.05 |
| 5,229,965 | 7/1993 | Inoue | 365/189.04 |
| 5,287,324 | 2/1994 | Nagashima | 365/230.05 |
| 5,325,502 | 6/1994 | McLaury | 395/425 |

Primary Examiner—David C. Nelms
Assistant Examiner—Tan Nguyen
Attorney, Agent, or Firm—Hopkins, Roden, Crockett, Hansen & Hoopes

[57] ABSTRACT

Data is fetched from one port of a multi-port memory circuit and loaded into another port of the same circuit for pre-loading a serial pipeline. A random access port of a DRAM circuit is used to pre-load a data signal into a serial output pipeline buffer associated with a SAM circuit in a VRAM device. The random access port accesses a particular column associated with a TAP address and reads the data for loading the first bit into the serial output buffer. The next data bit is loaded from the SAM into the serial port buffer when the first bit is output to the serial port. The time between serial clock pulses associated with the serial data path and output buffer is reduced to about 15 ns.

20 Claims, 4 Drawing Sheets

MEMORY CIRCUIT FOR PRE-LOADING A SERIAL PIPELINE

TECHNICAL FIELD

This invention relates in general to a memory circuit and method for loading a serial port, and in particular, for selectively loading a serial port from a Random Access Memory (RAM) circuit or from a Serial Access Memory (SAM) circuit.

BACKGROUND OF THE INVENTION

The search for faster, more efficient memory circuits is a constant goal in the ever progressing semiconductor market. Video Random Access Memory (VRAM) circuits outperform similar Dynamic Random Access Memory (DRAM) circuits for a variety of applications. This is due in part to an independent static memory, identified as a Serial Access Memory (SAM), incorporated in conjunction with a DRAM in the VRAM.

In a VRAM, data is capable of being transferred between the DRAM and SAM as necessary. Data transferred from the DRAM to the SAM is considered a read transfer, and data transferred from the SAM to the DRAM is a write transfer. Moreover, to use the SAM as a serial output port, the SAM is addressed in an incremental manner by an address counter/pointer, making it well suited for high speed sequential data streams.

A VRAM is advantageous over a DRAM, for example, because the VRAM increases the bandwidth of raster graphic display frame buffers. Namely, VRAM-based buffers give a Cathode Ray Tube (CRT) driver circuitry access to pixel data from the SAM port, alleviating any DRAM-port contention problem, and thus improving screen redraw performance when changing display information. DRAM-port access remains available to a graphics controller or coprocessor while screen refresh data is constantly supplied, independently, by the SAM port.

Although the VRAM offers its advantages, it retains a drawback in effectuating a Real-Time Read Transfer (RTRT) of data. For example, when display data needs to be changed immediately during a current refresh cycle of the CRT, the actual transfer of data must take place within one serial clock cycle (the cycle between the positive edge for the last piece of "old" data and the positive edge for the first piece of "new" data).

In order to speed up a Real-Time Read Transfer, circuitry has been developed in the prior art to pre-load the serial port buffer with a first bit of new data substantially simultaneously with the transfer of the rest of the data from DRAM to SAM which is to be serially output following the first bit. Details on this method of pre-loading the serial port are disclosed in U.S. patent application Ser. No. 07/701,470, entitled Pipelined SAM Register Serial Output, filed May 15, 1991, and assigned to Micron Technology, Inc.

Although the aforementioned application discloses a method of pre-loading the serial read pipe (i.e., a serial port having a buffer), it also retains a drawback. Namely, the timing involved in the steps for pre-loading the serial port mandate that the serial clock cycle be no less than about 50 nanoseconds (ns).

Given the continuous effort to increase speeds in the semiconductor and computing industries, a clock cycle of 50 ns is an undesirable limitation. Accordingly, objects of the present invention are to provide an improved memory circuit and method for pre-loading a serial port pipe with significantly improved clock cycle performance for Real-Time Read Transfers.

SUMMARY OF THE INVENTION

According to principles of the present invention in its preferred embodiment, data is read from one port of a multi-port memory circuit and loaded into another port of the same circuit. More particularly, a random access port of a DRAM circuit is used to pre-load a data signal into a serial output pipeline buffer associated with a SAM circuit in a VRAM device. The majority of this pre-loading happens before a true Read Transfer occurs from DRAM to SAM.

According to further principles of the present invention, when Column Address Select ($\overline{CAS}$) is brought low to bring in a TAP address (the column address associated with a first bit of data to be read), the random access port accesses the particular column associated with that TAP address and reads the data for loading the first bit into the serial output buffer. The TAP address is also loaded into the serial counter associated with the SAM register and incremented for reading the next data bit in the SAM and for subsequently loading the next bit to the serial port buffer.

According to further principles of the present invention, the data retrieved by the random access read is loaded into a Master component of a Master/Slave output buffer circuit associated with the serial data path/port of the SAM. This is accomplished by coupling the Input/Output (I/O) data path bus of the random access port to the Master of the serial data output buffer.

According to further principles of the present invention, the time between serial clock pulses associated with the serial data path and output buffer is reduced to about 15 ns.

Other objects, advantages, and capabilities of the present invention will become more apparent as the description proceeds.

DETAILED DESCRIPTION OF THE INVENTION

Figure 1:
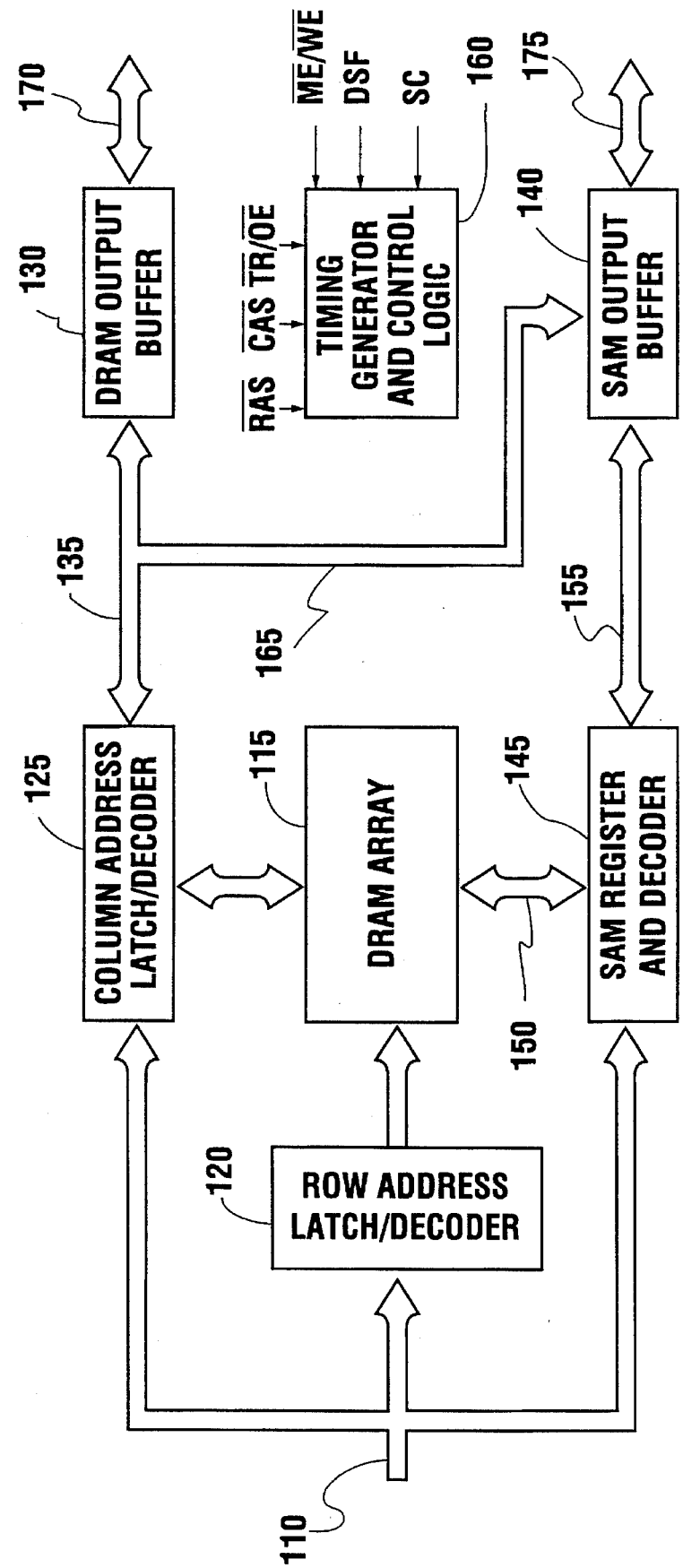
FIG. 1 is a block diagram depicting the invention reading data from one port of a multi-port memory and loading it into another port of the same memory circuit.

FIG. 1 is a block diagram generally depicting the invention reading data from one port of a multi-port memory and loading it into another port of the same memory circuit. A simplified, typical VRAM block layout is depicted. Address lines 110 provide an address for accessing a plurality of memory cells in main memory block DRAM array 115 via Row Address Latch/Decoder 120 and Column Address Latch/Decoder 125.

Typically, random access data is transferred between

DRAM array 115, DRAM output buffer 130, and random access port 170 via DRAM Input/Output (I/O) data path 135. Distinctly, serial access data is transferred between DRAM array 115, SAM output buffer 140, and serial access port 175 via SAM register and decoder 145, DRAM to SAM I/O data path 150, and SAM data path 155. Timing Generator and Control Logic 160 is representative of the signals and logic necessary for the VRAM circuitry to function properly.

However, according to the present invention depicted, more than one transfer means communicates between the main memory block and the serial access port output buffer. Namely, connector data path 165 couples DRAM data path 135 with SAM output buffer 140 to establish a first transfer means and a first data path communicating between the main memory block and the output buffer. This novel aspect allows data from DRAM array 115 to be loaded into SAM output buffer 140 via DRAM I/O data path 135. In essence, random access port 170 of the memory is used to pre-load serial port 175.

A second transfer means and second data path communicating between the main memory block and the serial output buffer comprises the aforementioned DRAM to SAM I/O data path 150, and SAM data path 155. Accordingly, first and second transfer means selectively transfer the data signal from the main memory block to serial output buffer 140 and port 175. The first transfer means is used to pre-load serial buffer 140 with a first bit of data, and the second transfer means is used to load the buffer with a next bit of data for faster, serial clocked, pipelined serial output.

The majority of this pre-loading happens before a true Read Transfer ever occurs. Namely, when a Real-Time Read Transfer (RTRT) is sensed (see FIG. 2 for further RTRT detail) and $\overline{CAS}$ is brought low to bring in the TAP address, the random access port will access the particular column in DRAM 115 associated with that TAP address and read it. The TAP address will also eventually be loaded into a serial counter associated with the SAM register, and the counter is incremented to address the next bit of data. Now, when the Transfer Enable/Output Enable ($\overline{TR/OE}$) pin goes high and the DRAM to SAM transfer is actually proceeding, the first bit of data retrieved by the random access read can be loaded into SAM output buffer 140 of serial port 175 via connector data path coupling 165. In response to a clock signal, the next bit of data is loaded into SAM output buffer 140 via SAM data path 155 substantially simultaneously with the first bit of data being output to serial port 175.

A preferred embodiment of connector data path coupling 165 includes common inverter drivers and latching in order to present the data at the serial port at an appropriate time. See FIG. 3 for further details.

Figure 2:
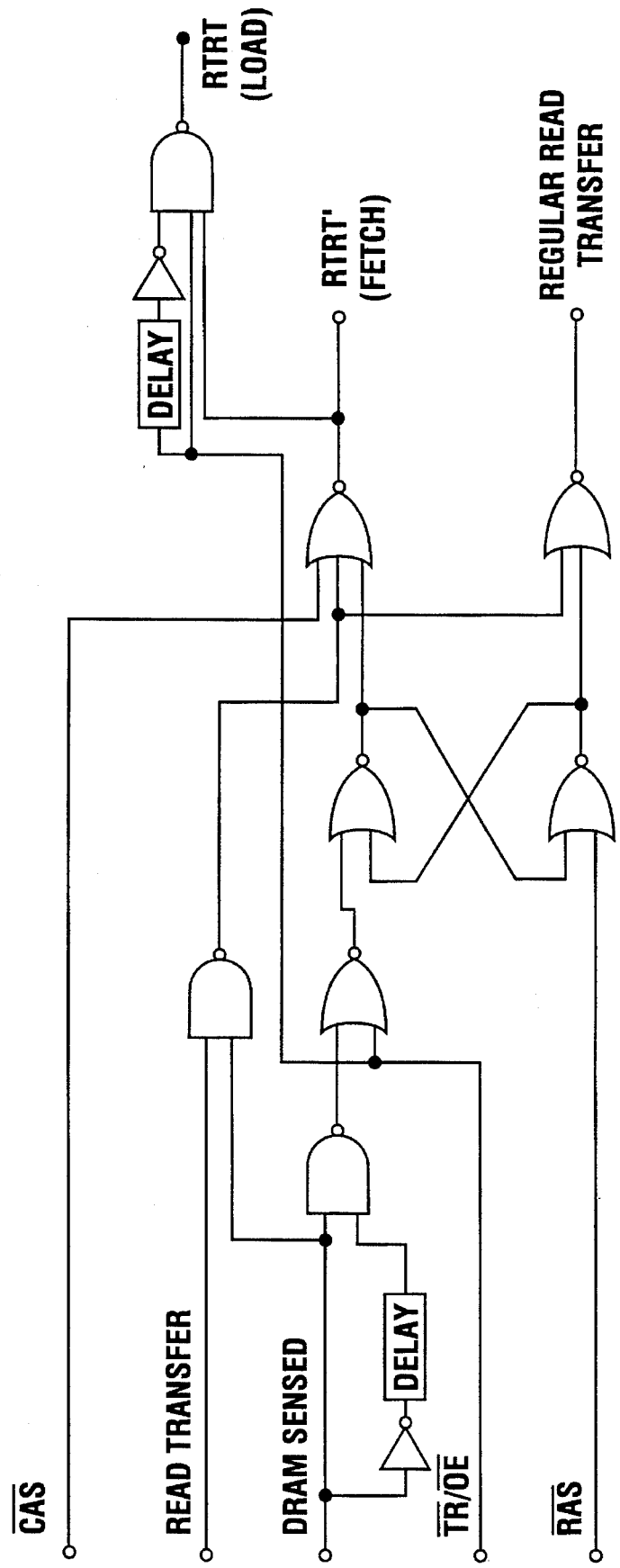
FIG. 2 illustrates a schematic block diagram of a circuit for signaling the occurance of a Real-Time Read Transfer (RTRT).

FIG. 2 illustrates a schematic block diagram of a circuit for signaling the occurance of a Real-Time Read Transfer (RTRT). With this simple configuration, an appropriate combination of $\overline{CAS}$, RAS, $\overline{TR/OE}$, Read Transfer and DRAM Sensed signals produces an RTRT' signal for allowing random access port 170 (FIG. 1) to fetch the first bit of data and an RTRT signal for loading the data into serial port 175. The circuit also produces a Regular Read Transfer signal to allow non RTRT processing as necessary.

To produce the RTRT' and RTRT signals, the $\overline{CAS}$, RAS, and $\overline{TR/OE}$ signals are received from Timing Generator and Control Logic 160 (see FIG. 1). The Read Transfer signal is generated by the $\overline{TR/OE}$ signal being low and the Mask Enable/Write Enable ($\overline{ME/WE}$) signal being high (FIG. 1) when $\overline{RAS}$ transitions from high to low. Finally, the DRAM Sensed signal is generated by data bits being dumped on the I/O lines with a decision as to their intended value.

Figure 3:
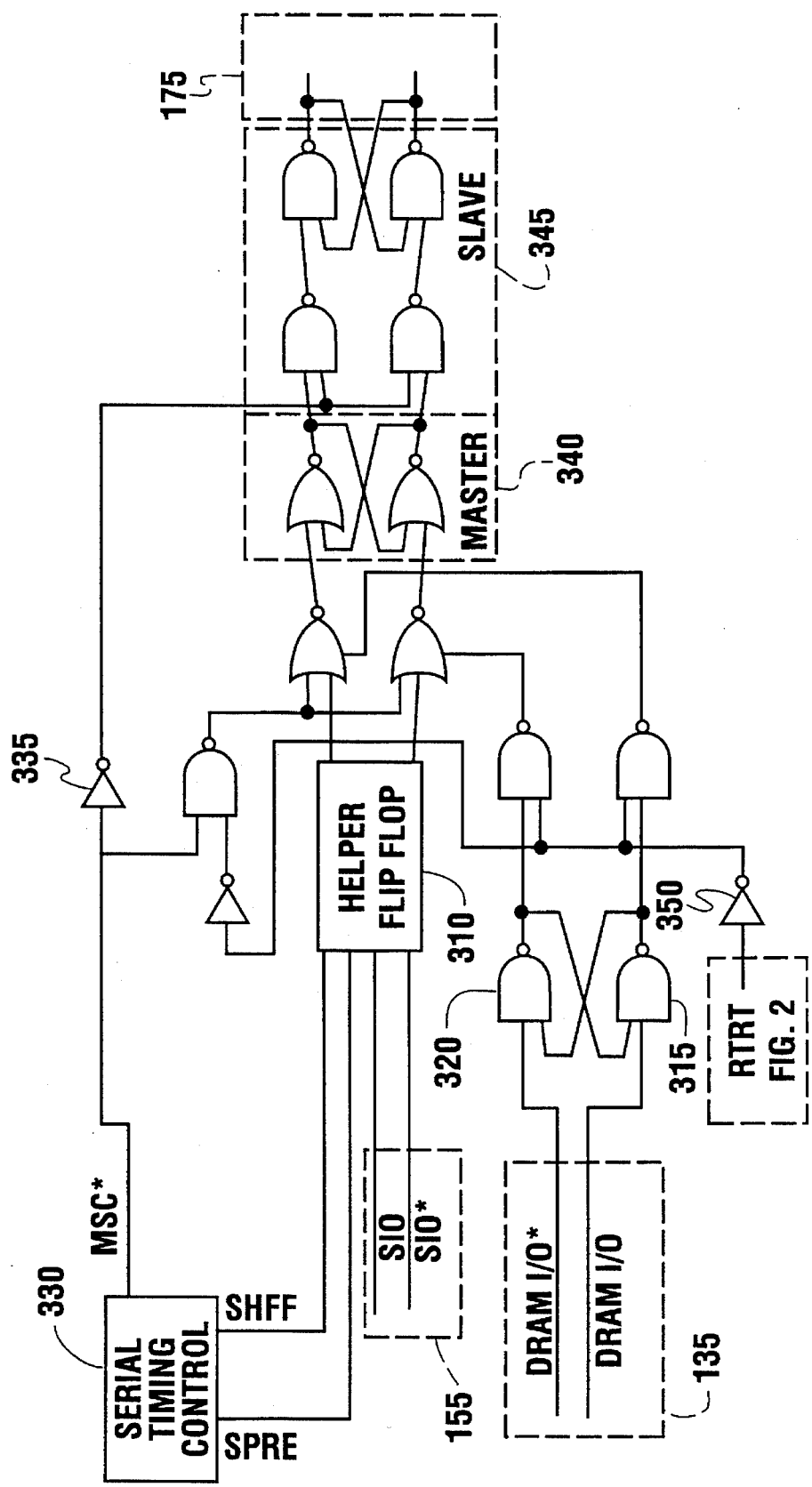
FIG. 3 is a schematic block diagram of a circuit for loading data from a selected memory input/output data path to a serial output buffer.

FIG. 3 is a schematic block diagram of a circuit for loading data from a selected memory input/output data path to a serial output buffer. Signal RTRT is provided to inverter 350 for indicating that a Real-Time Read Transfer is occurring and for selecting the data path from which to load data into serial port 175.

Upon recognition of an RTRT' signal (see FIG. 2), a first bit of data is fetched from DRAM array 115 via DRAM I/O data path 135. Then, upon a RTRT signal, the first bit of data is preloaded into Master component 340 of the Master/Slave output buffer coupled to serial port 175. DRAM I/O data path 135 provides signals DRAM I/O and DRAM I/O* to nand gates 315 and 320 respectively. Substantially simultaneously, data associated with the row address of the first bit of data is passed from DRAM 115 to SAM 145 (FIG. 1), and a counter/pointer associated with SAM 145 is incremented to address a next bit of data in the SAM to be loaded into Master 340 following the first bit.

Upon the next serial clock rising edge signal, the first bit of data is transferred to Slave component 345 and serial port 175. Also upon the same next serial clock edge, the next bit is transferred via SAM data path 155, signal lines SIO and SIO* and Helper Flip Flop 310 to load Master component 340.

Serial Timing Control 330 provides a Serial Precharge signal SPRE and a Strobe Helper Flip Flop signal SHFF to Helper Flip Flop 310. The SPRE signal precharges the serial lines, and the SHFF signal activates the flip flop for transfer of the data.

Serial Timing Control 330 also provides Master to Slave Coupling signal MSC* to inverter 335 for controlling the transfer of data between Master component 340 and Slave component 345 of the Master/Slave output buffer coupled to serial port 175.

Since master component 340 receives data not only from DRAM I/O data path 135, but from SAM data path 155 as well, a potential data contention at serial port 175 is created. This contention is negated by overriding the coupling between Helper Flip-Flop 310 and Master 340 for a sufficient period of time to allow Helper Flip-Flop 310 to re-enter precharge. Thus, when data is loaded via DRAM I/O data path 135, SAM data path 155 is decoupled.

Figure 4:
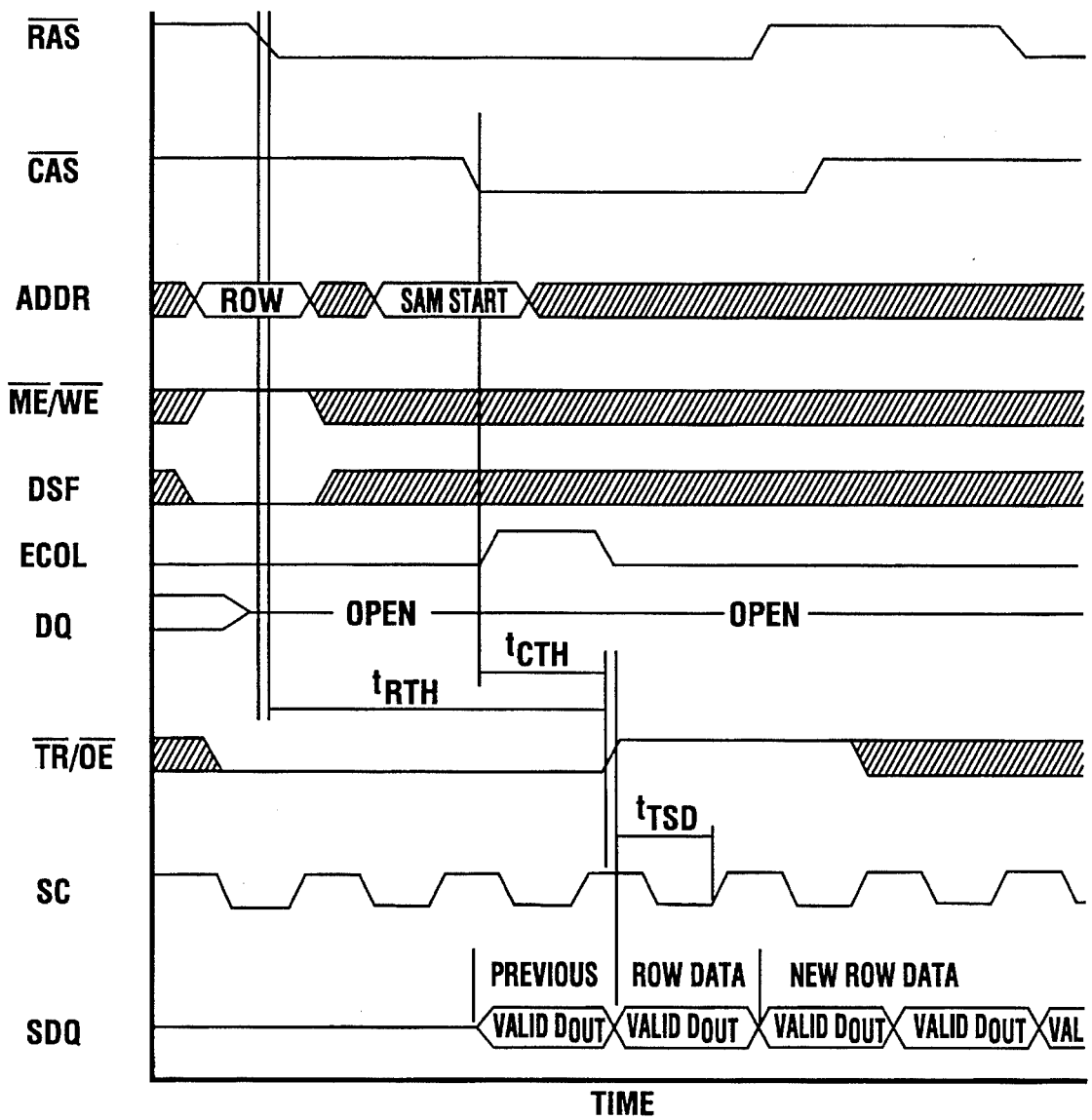
FIG. 4 depicts a timing diagram for a Real-Time Read Transfer (DRAM to SAM transfer), including pre-loading data into a serial access port from a random access port.

FIG. 4 depicts a timing diagram for a Real-Time Read Transfer (DRAM to SAM transfer), including pre-loading data into a serial access port from a random access port. As depicted by signal DQ, during a DRAM to SAM read transfer cycle there is no activity associated with the random access port. Moreover, 'CTH and 'RTH indicate an allowance for the time required to use the random access port to fetch a first bit of data from the column whose address is in common with the SAM START (TAP) address.

Thus, from a timing perspective, it is feasible to employ the random access port to pre-load the serial port as follows:
1. $\overline{RAS}$ falls—which selects and senses the row in DRAM to be transferred (as well establishes that the part is in Read Transfer mode).
2. $\overline{CAS}$ falls—traps the new TAP address for the serial port (identified as SAM START), as well traps the information in the Column address latch.
3. RTRT goes high—the circuit of FIG. 2 indicates a Real-Time Read Transfer is in progress, which activates the RAM column decode.
4. ECOL goes high—which indicates the DRAM is ready for column access to begin, and enables random access to fetch the bit via the column decoder and DRAM I/O data path.

5. SC rises—the serial clock (SC) rises bringing out the last piece of old data from SAM (previous row).
6. TR/OE goes high—simultaneously passes the DRAM row to the SAM; loads the Master of the serial port with the first bit of new row data that was fetched via column decode; and loads TAP into the SAM register serial counter and increments the counter to point to the next data.
7. SC rises—delivers first bit of new row data in Master to Slave and SDQ pad, and loads the Master with the next data from SAM.

It is realized from this sequence that the time between SC pulse (rising edges) can greatly be reduced from the prior art. In fact, once the new data is loaded into the Master via Column decode and the DRAM I/O data path, the next SC clock can occur. This may occur even before the pulse transferring the data from DRAM to SAM has gone away. Thus, a 'TSD of less than 15 ns can be realized.

What has been described above are the preferred embodiments for a memory circuit for pre-loading a serial pipeline. It is clear that the present invention provides a powerful tool for significantly improving clock cycle performance for Real-Time Read Transfers. While the present invention has been described by reference to specific embodiments, it will be apparent that other alternative embodiments and methods of implementation or modification may be employed without departing from the true spirit and scope of the invention.

What is claimed is:

1. A memory circuit for loading a first and second data signal into a serial output buffer, comprising:
    a) a main memory block having a plurality of memory cells;
    b) first transfer means communicating between the main memory block and the serial output buffer for selectively transferring the first data signal from the main memory block to the serial output buffer;
    c) second transfer means communicating between the main memory block and the serial output buffer for selectively transferring the second data signal from the main memory block to the serial output buffer; and
    d) timing means for timing the transferring of the first and second data signals to the serial output buffer, wherein the first data signal is transferred to the serial output buffer prior to the second data signal, and wherein the first data signal is latched into the serial output buffer substantially concurrently with an en route transferring of the second data signal to the serial output buffer.

2. The memory circuit of claim 1 wherein the first transfer means comprises:
    a) a random access circuit for selectively accessing any of the plurality of memory cells; and,
    b) a first data path for transferring the first data signal from any of the plurality of memory cells to the serial output buffer.

3. The memory circuit of claim 2 wherein the first data path includes a Random Access Memory (RAM) Input/Output (I/O) data path.

4. The memory circuit of claim 1 wherein the second transfer means comprises:
    a) a register memory circuit for substantially simultaneously accessing a plurality of the memory cells, and for loading the second data signal from an accessed memory cell into the register memory circuit; and,
    b) a second data path for transferring the second data signal from the register memory circuit to the serial output buffer.

5. The memory circuit of claim 4 wherein the register memory circuit is a Serial Access Memory (SAM).

6. A memory circuit for pre-loading a first data signal into a serial output buffer, the buffer being coupled to a Serial Access Memory (SAM) register and a Random Access Memory (RAM) array circuit, the memory circuit comprising:
    a) first address means, including a row address and a column address, for selectively addressing the first data signal in the RAM;
    b) first loading means for loading the first data signal from the RAM into the serial output buffer;
    c) transfer means for transferring a plurality of data signals from the RAM to the SAM, the plurality of data signals being associated with the row address of the first data signal;
    d) second address means for addressing a second data signal in the SAM;
    e) second loading means for loading the second data signal from the SAM into the serial output buffer;
    f) timing means for timing the first and second loading means wherein the first data signal is loaded into the serial output buffer substantially simultaneously with the transferring of the plurality of data signals from the RAM to the SAM, and the second data signal is loaded into the serial output buffer following the first data signal.

7. The memory circuit of claim 6 wherein the first loading means includes a RAM Input/Output (I/O) data path, and wherein the first data signal is loaded from the RAM into the serial output buffer via the RAM I/O data path.

8. The memory circuit of claim 7 wherein the first loading means further includes data path coupling means wherein the RAM I/O data path is coupled to the serial output buffer, and wherein the first data signal is selectively loaded from the RAM I/O data path into the serial output buffer.

9. The memory circuit of claim 6 wherein the serial output buffer comprises a master-slave circuit having a master component circuit coupled to a slave component circuit.

10. The memory circuit of claim 9 wherein the first and second data signals are loaded into the master component of the master-slave circuit.

11. The memory circuit of claim 10 wherein the first data signal is loaded from the master component into the slave component and an output port substantially simultaneously with the loading of the second data signal into the master component.

12. The memory circuit of claim 11 wherein the first data signal is loaded into the master component upon a sensing of a real-time read transfer signal.

13. The memory circuit of claim 12 wherein the second data signal is loaded into the master component, and the first data signal is loaded into the slave component from the master component, upon a sensing of a clock signal.

14. A method for loading a serial output buffer, comprising the steps of:
    a) loading a first data signal from a first memory circuit into the output buffer;
    b) transferring a second data signal from the first memory circuit to a second memory circuit substantially simultaneously with the loading of the first data signal into the output buffer; and,
    c) loading the second data signal from the second memory circuit into the output buffer following the first data signal.

15. The method according to claim 14 wherein the first memory circuit is a Random Access Memory (RAM) circuit.

16. The method according to claim 14 wherein the second memory circuit is a register memory circuit.

17. The method according to claim 14 wherein the second memory circuit is a Serial Access Memory (SAM) circuit.

18. The method according to claim 14 wherein the step of loading the first data signal includes loading via an input/output CIO) data path coupled between the first memory circuit and the output buffer.

19. The method according to claim 14 further including the step of loading the first data signal into the output buffer upon sensing a real-time read transfer signal.

20. The method according to claim 19 further including transmitting the first data signal from the buffer to an output port substantially simultaneously with the loading of the second data signal from the second memory circuit into the output buffer in response to a clock signal.

* * * * *